(12) United States Patent
Cha et al.

(10) Patent No.: US 7,782,667 B2
(45) Date of Patent: Aug. 24, 2010

(54) METHOD OF OPERATING A FLASH MEMORY DEVICE

(75) Inventors: Jae Won Cha, Seoul (KR); Sam Kyu Won, Yongin-si (KR); In Ho Kang, Seoul (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 128 days.

(21) Appl. No.: 12/119,402

(22) Filed: May 12, 2008

(65) Prior Publication Data

US 2009/0225593 A1    Sep. 10, 2009

(30) Foreign Application Priority Data

Mar. 10, 2008    (KR) .................. 10-2008-0021938

(51) Int. Cl.
    *G11C 16/06*    (2006.01)
(52) U.S. Cl. .............................. 365/185.03; 365/185.2
(58) Field of Classification Search ................ 365/168
    See application file for complete search history.

(56) References Cited

U.S. PATENT DOCUMENTS

| | | | |
|---|---|---|---|
| 5,680,343 A * | 10/1997 | Kamaya .................... 365/104 |
| 5,745,409 A * | 4/1998 | Wong et al. ............. 365/185.03 |
| 5,831,900 A * | 11/1998 | Miyamoto ............. 365/185.03 |
| 6,657,891 B1 * | 12/2003 | Shibata et al. .......... 365/185.03 |
| 6,876,578 B2 * | 4/2005 | Shibata et al. .......... 365/185.03 |
| 6,925,004 B2 * | 8/2005 | Shibata et al. .......... 365/185.03 |
| 6,999,349 B2 | 2/2006 | Misumi et al. |
| 7,057,939 B2 | 6/2006 | Li et al. |
| 7,245,528 B2 * | 7/2007 | Shibata et al. .......... 365/185.03 |
| 7,272,041 B2 * | 9/2007 | Rahman et al. ........ 365/185.03 |
| 7,548,457 B2 * | 6/2009 | Kang et al. ............. 365/185.03 |

\* cited by examiner

*Primary Examiner*—Tan T. Nguyen
(74) *Attorney, Agent, or Firm*—Townsend and Townsend and Crew LLP

(57) ABSTRACT

A method of operating a flash memory device includes reading a first bit data by employing a first read voltage or a second read voltage higher than the first read voltage according to a program state of a first flag cell. The first flag cell is programmed when the first bit data is programmed into the MLC. A second bit data may be read by employing a third read voltage that is higher than the first read voltage or the second read voltage, or by employing the first read voltage and the third read voltage according to a program state of a second flag cell. The second flag cell is programmed when the second bit data is programmed into the MLC. Alternatively to reading the second bit data, the second bit data is fixed to a set data and the set data is output.

18 Claims, 15 Drawing Sheets

METHOD OF OPERATING A FLASH MEMORY DEVICE

CROSS-REFERENCES TO RELATED APPLICATIONS

The present application claims priority to Korean patent application number 10-2008-21938, filed on Mar. 10, 2008, which is incorporated by reference in its entirety.

BACKGROUND OF THE INVENTION

The present invention relates to an operation of a flash memory device including a multi-level cell (MLC) and, more particularly, to a method of operating a flash memory device with high reliability in reading programmed data.

A NAND flash memory device includes a memory cell array, a row decoder, and a page buffer. The memory cell array includes a plurality of word lines extending along rows, a plurality of bit lines extending along columns, and a plurality of cell strings corresponding to the bit lines.

The row decoder connected to a string select line, word lines, and a common source line is disposed on one side of the memory cell array. The page buffer connected to the plurality of bit lines is disposed on the other side of the memory cell array.

In recent years, to further increase the integration level of this flash memory, active research has been done on a multi-bit cell that is able to store a plurality of data in one memory cell. This type of a memory cell is called a MLC. A single bit memory cell is called a single level cell (SLC).

A MLC capable of storing 4-bit or 8-bit data information has recently been developed out of 2-bit data information. Technologies for improving operational reliability of a chip are required to address abnormal conditions that occur during MLC chip operation (for example, power-off due to the consumption of a battery).

BRIEF SUMMARY OF THE INVENTION

The present invention is directed towards a method of operating a flash memory device which can determine the progress of a MLC program according to the program state of a flash memory device including a MLC, and which can perform proper verification or data reading.

According to an aspect of the present invention, a method of operating a flash memory device including a MLC capable of storing plural bits of data therein, includes reading a first bit data by employing a first read voltage or a second read voltage higher than the first read voltage according to a program state of a first flag cell. The first flag cell is programmed when the first bit data is programmed into the MLC. A second bit data may be read by employing a third read voltage higher than the first read voltage or the second read voltage or by employing the first read voltage and the third read voltage according to a program state of a second flag cell. The second flag cell is programmed when the second bit data is programmed into the MLC. Alternatively to reading the second bit data, the second bit data is fixed to a set data and the set data is output.

According to another aspect of the present invention, a method of operating a flash memory device including a MLC capable of storing plural bits of data therein, includes reading and outputting a first bit data using a first read voltage or a second read voltage, which is higher than the first read voltage, depending on a program state of a flag cell that is programmed when first and second bit data are programmed into the MLC; and reading data using the first read voltage and a third read voltage, which is higher than the second read voltage, or fixing the data to a set data and outputting the set data, according to a program state of the flag cell.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1A:
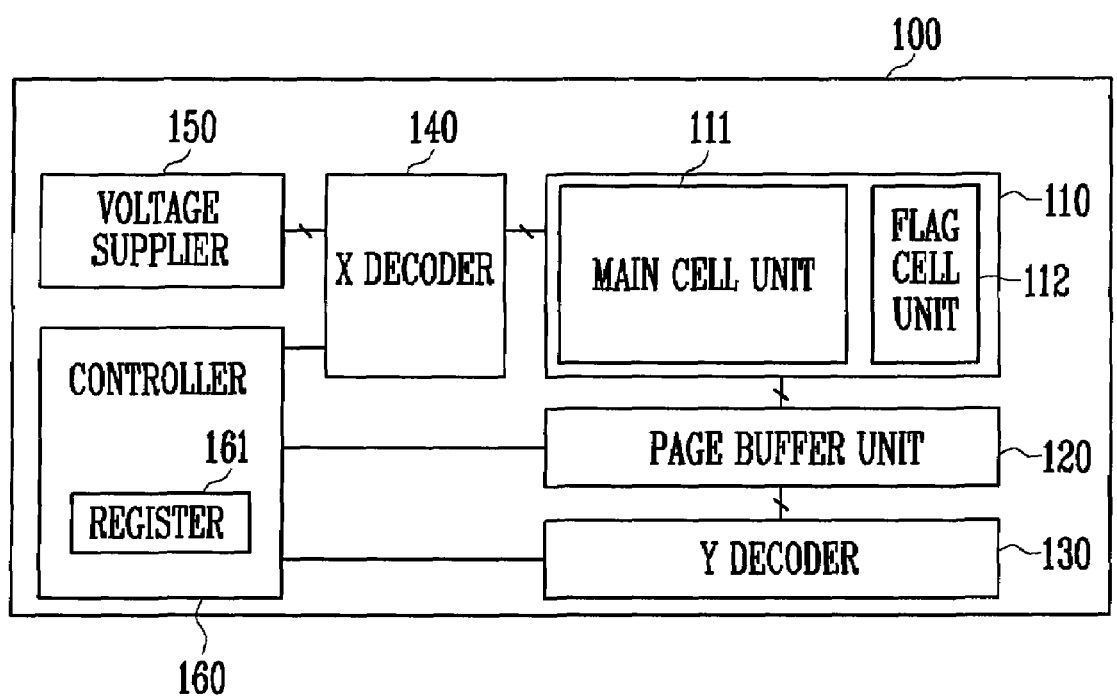
FIG. 1A is a block diagram showing a flash memory device in accordance with an embodiment of the present invention.

FIG. 1A is a block diagram showing a flash memory device in accordance with an embodiment of the present invention.

Referring to FIG. 1A, a flash memory device 100 in accordance with an embodiment of the present invention includes a memory cell array 110 in which memory cells capable of storing 2-bit data therein are constructed in a word line and bit lines.

The flash memory device 100 further includes a page buffer unit 120 having a page buffer connected to a pair of the bit lines of the memory cell array 110. The page buffer performs an operation of programming data into a memory cell and reading data stored in a memory cell.

The flash memory device 100 further includes a Y decoder 130 for selecting a page buffer of the page buffer unit 120 according to input address information and connecting a selected page buffer to an output path, and an X decoder 140 for selecting a word line of the memory cell array 110 according to an input address.

The flash memory device 100 further includes a voltage supplier 150 for generating and supplying an operating voltage for the operation of the flash memory device 100, and a controller 160 for controlling the operation of the flash memory device 100.

The memory cell array 110 includes a main cell unit 111 having main cells for storing data, and a flag cell unit 112 having flag cells for storing flag information to indicate the programmed status of a memory cell of the main cell unit 111.

The page buffer of the page buffer unit 120 is connected to a pair of bit lines, and functions to program data into a memory cell or read data stored in a memory cell under the control of the controller 160.

The voltage supplier 150 generates a program voltage, a read voltage, a pass voltage, etc. and supplies the voltages for a corresponding operation. The controller 160 generates a control signal for operation of the flash memory device 100. The controller 160 includes a register 161 for storing an algorithm for operation control, option information, voltage information, etc.

The register 161 stores programs, an algorithm necessary for controlling a read operation, and voltage information. The controller 160 performs operation control based on the information stored in the register 161.

The construction of the memory cell array 110 is described below in more detail.

Figure 1B:
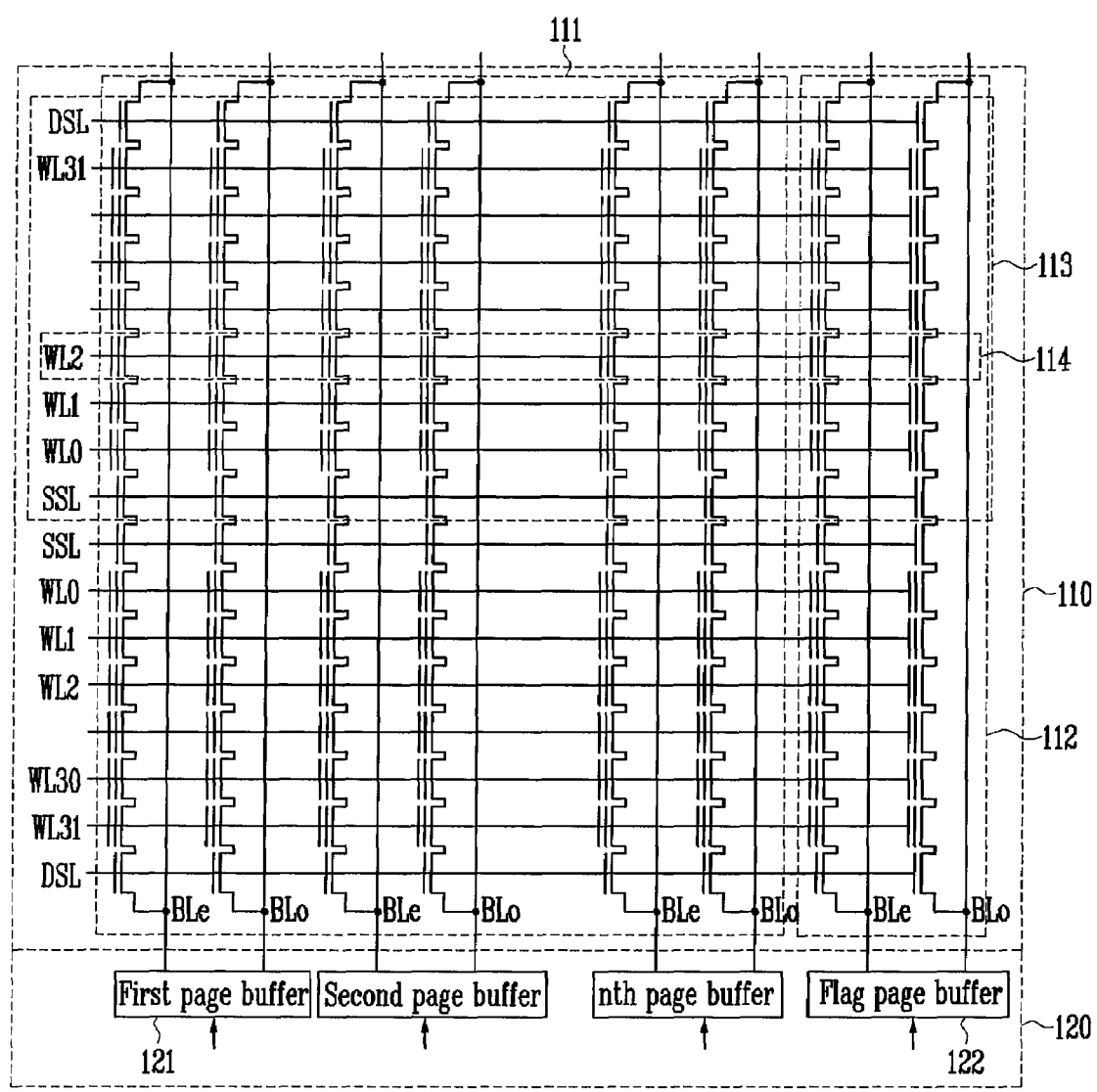
FIG. 1B is a partial detailed circuit diagram of FIG. 1A.

FIG. 1B is a partial detailed circuit diagram of FIG. 1A.

Referring to FIG. 1B, the memory cell array 110 includes a plurality of memory blocks 113. Each memory block 113 includes the main cell unit 111 and the flag cell unit 112. Further, the main cell unit 111 and the flag cell unit 112 are connected to each other through the word line, thereby constituting a plurality of pages 114.

Further, a pair of bit lines (that is, an even bit line BLe and an odd bit line BLo) is connected to one page buffer. The page buffer unit 120 includes first to $n^{th}$ page buffers 121, and one or more flag page buffers 122 connected to the bit lines of the flag cell unit 112.

The main cell and the flag cell of the flash memory device 100 in accordance with an embodiment of the present invention is a MLC capable of storing 2-bit data and can be programmed to have the following threshold voltage distributions.

Figure 2A:
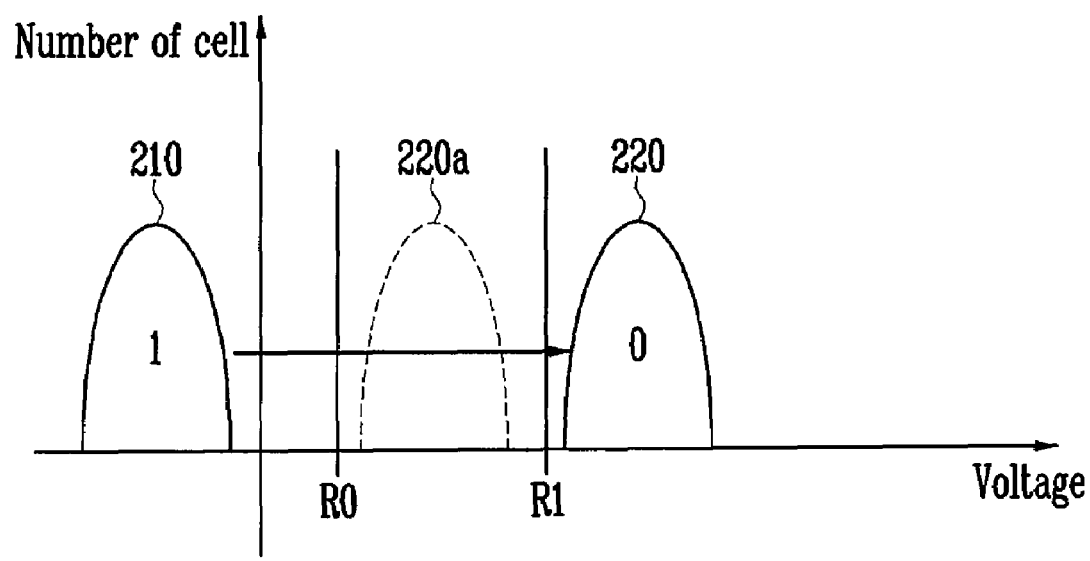
FIG. 2A illustrates the movement of threshold voltage distributions through a least significant bit (LSB) program.
Figure 2B:
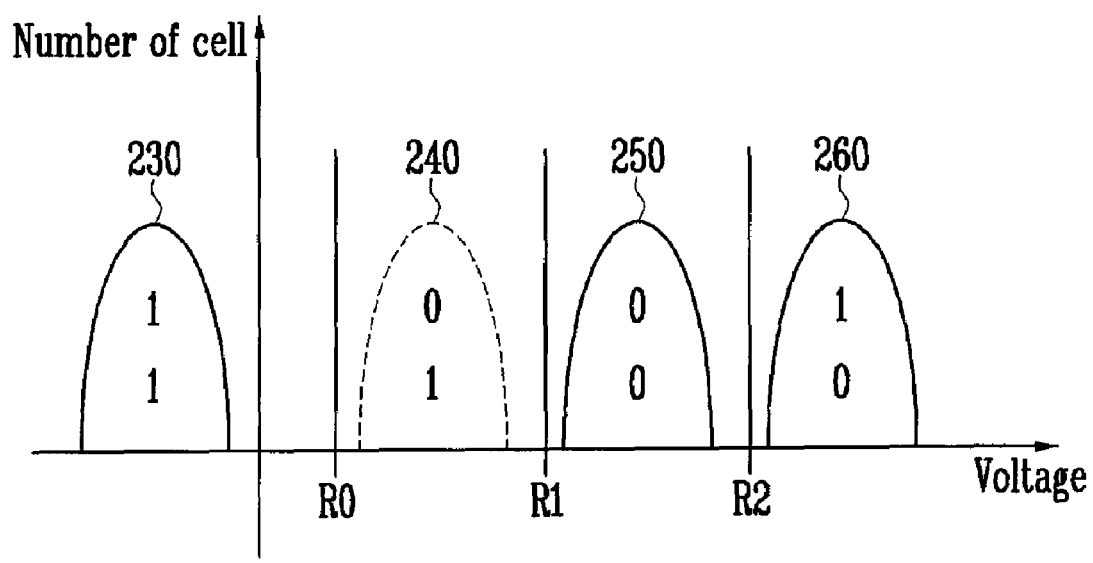
FIG. 2B illustrates the movement of threshold voltage distributions through a most significant bit (MSB) program.

FIGS. 2A and 2B illustrate the movement of threshold voltage distributions of a 2-bit MLC in accordance with an embodiment of the present invention. FIG. 2A illustrates the movement of threshold voltage distributions through a LSB program and FIG. 2B illustrates the movement of threshold voltage distributions through a MSB program.

MLCs capable of storing 2-bit data in accordance with an embodiment of the present invention (the main cells or both the main cells and flag cells described with reference to FIGS. 1A and 1B) perform a LSB program and a MSB program in a first threshold voltage distribution (210) state of an erase state. First and second flag cells, respectively indicating that the LSB program and the MSB program have been completed, are used.

Referring to FIG. 2A, if the LSB program is performed, some of MLCs belonging to the first threshold voltage distributions 210 are programmed so that they are included in second threshold voltage distributions 220. The threshold voltages of the MLCs, which are programmed to belong to the second threshold voltage distributions 220, sequentially increase from the first threshold voltage distributions 210, pass through threshold voltage distributions 220a, and then reach the second threshold voltage distributions 220. The LSB program is then finished.

If a MSB program is performed on the MLCs after the LSB program is completed, threshold voltage distributions as shown in FIG. 2B result.

Referring to FIG. 2B, the MLCs on which the MSB program has been performed belong to third to sixth threshold voltage distributions 230 to 260. According to an embodiment of the present invention, MLCs have data states employing gray code. In other words, a MLC belonging to the third threshold voltage distributions 230 has the data state [11], a MLC belonging to the fourth threshold voltage distributions 240 has the data state [01], a MLC belonging to the fifth threshold voltage distributions 250 has the data state [00], and a MLC belonging to the sixth threshold voltage distributions 260 has the data state [10].

Flag cells are used to store information about completed states of the LSB program and the MSB program according to the progress of a MLC program. Data reading can be implemented in various ways according to program methods of flag cells. It can be performed as follows.

Figure 3A:
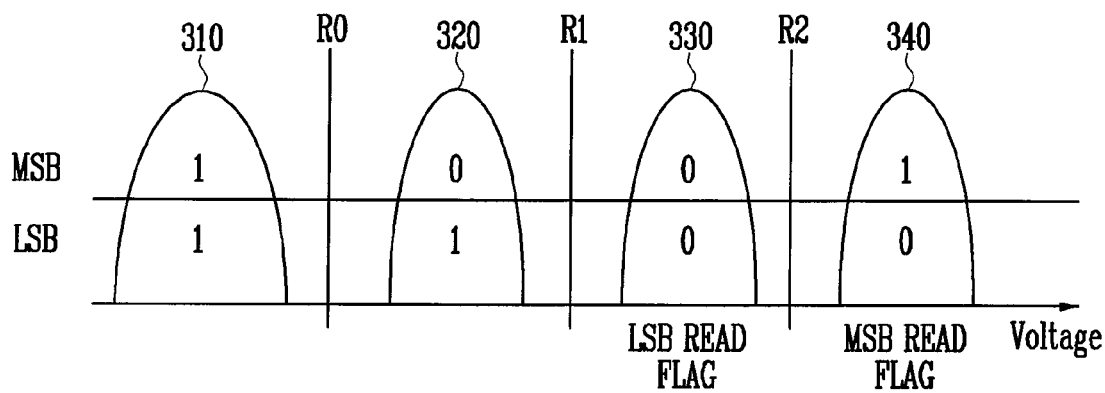
FIG. 3A illustrates threshold voltage distributions of flag cells and FIGS. 3B to 3D are flowcharts illustrating a data read operation, according to a first embodiment of the present invention.
Figure 3B:
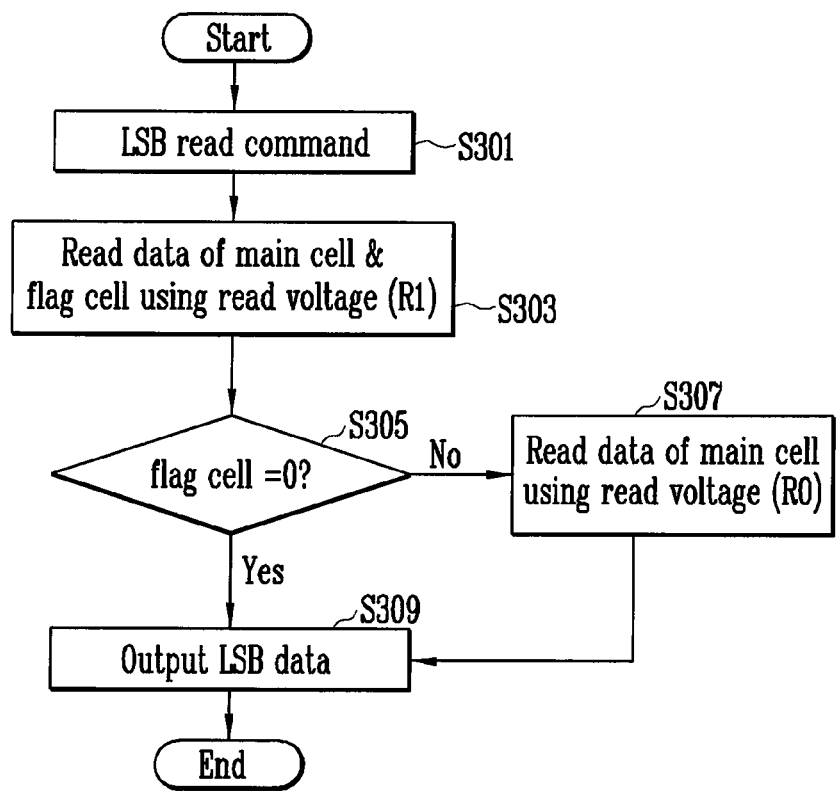
Figure 3C:
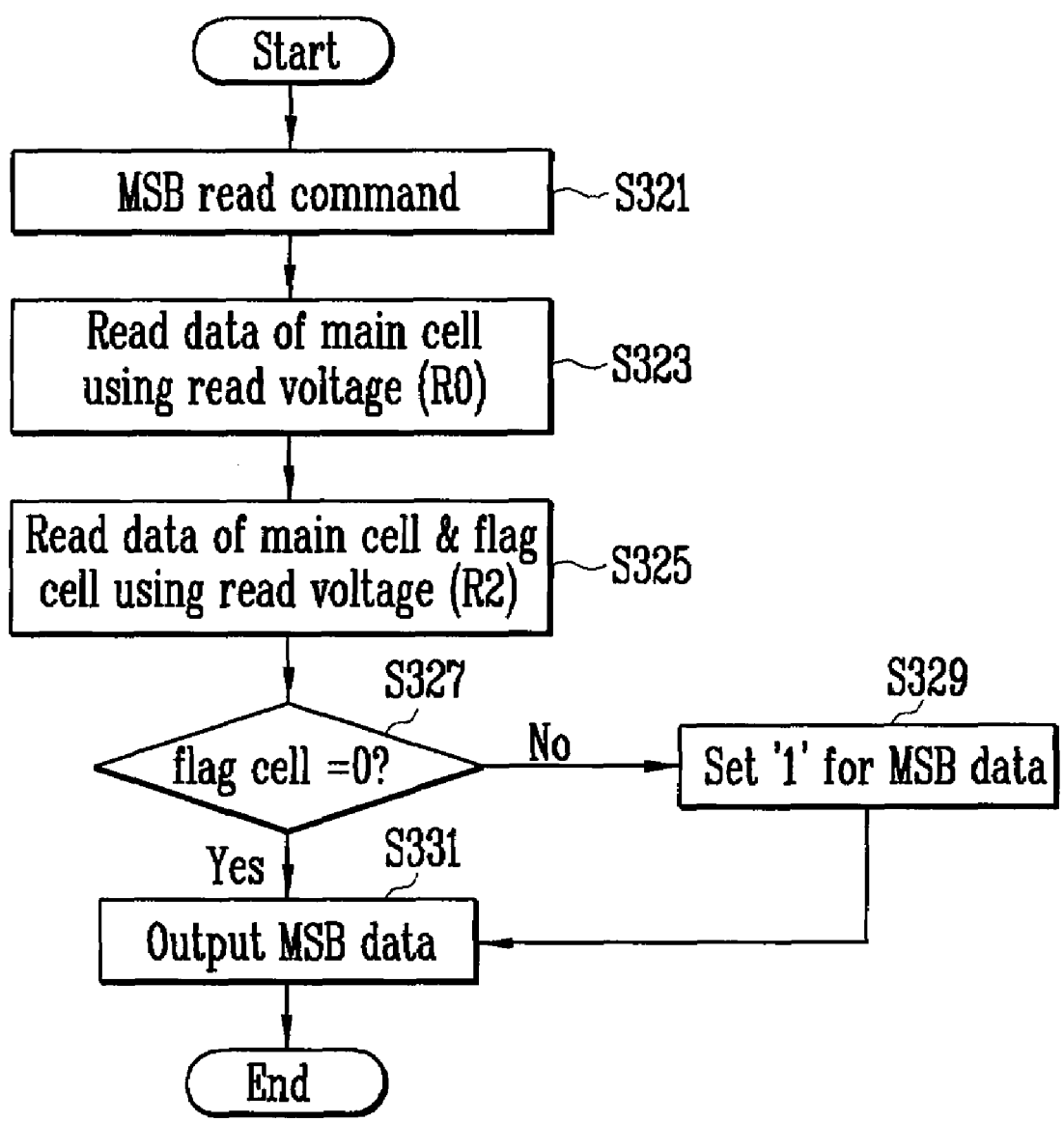
Figure 3D:
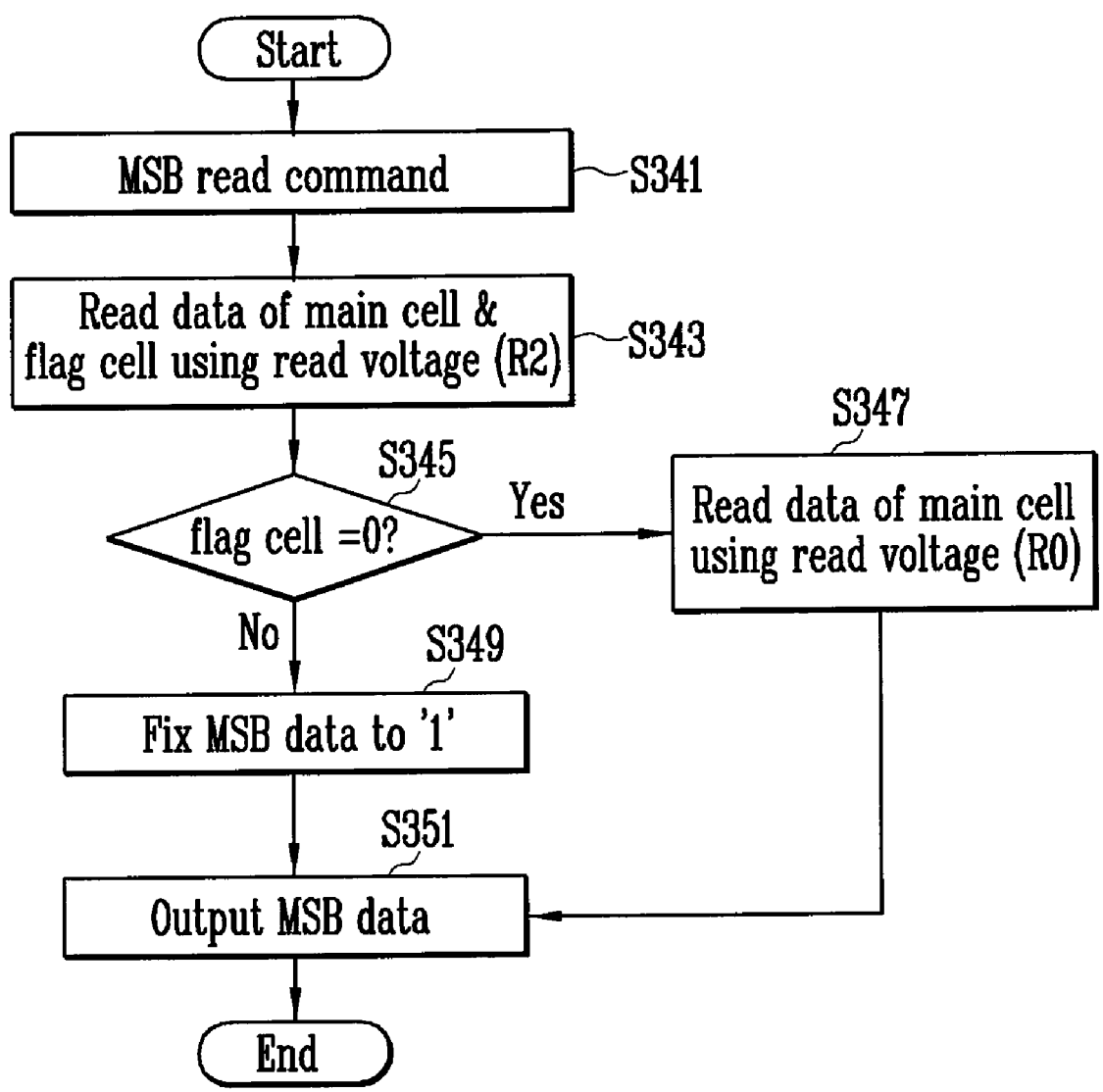

FIG. 3A illustrates threshold voltage distributions of flag cells and FIGS. 3B to 3D are flowcharts illustrating a data read operation, according to a first embodiment of the present invention.

FIG. 3A illustrates threshold voltage distributions of flag cells according to a first embodiment of the present invention. FIG. 3B is a flowchart illustrating a LSB data read method of the flash memory device including the flag cells of FIG. 3A. FIG. 3C is a flowchart illustrating a MSB data read method of the flash memory device including the flag cells of FIG. 3A. FIG. 3D is another flowchart illustrating a MSB data read method of the flash memory device including the flag cells of FIG. 3A.

Referring to FIG. 3A, in a first embodiment of the present invention, flag cells that can be programmed to have first to fourth threshold voltage distributions 310 to 340 are employed. When a LSB program is completed, a first flag cell is programmed to belong to the third threshold voltage distributions 330. When a MSB program is completed, a second flag cell is programmed to belong to the fourth threshold voltage distributions 340.

Further, to read data when the above flag cells are employed can be performed as in FIGS. 3B to 3D. In the sequence of the data reading, LSB data is first read and MSB data is then read.

Referring to FIG. 3B, if a LSB data read command is input at step S301, both main cells and flag cells are read using a read voltage R1 at step S303. Data of the main cells is stored in the first to $n^{th}$ page buffers and data of the flag cells is stored in the flag page buffer 122.

It is then determined whether the data stored in the first flag cell has a value '0' at step S305. That is, it is determined whether the data stored in the first flag cell belongs to the third threshold voltage distributions 330 or more based on the read voltage R1. If, as a result of the determination at step S305, the data stored in the first flag cell has the value '0', it can be determined that the LSB program has been completed on corresponding main cells.

After the LSB program is completed on the main cells, the LSB data can be divided into '1' or '0' based on the read voltage R1. Thus, when the first flag cell is '0', the read data is output to the main cell as the LSB data without change at step S309.

However, if, as a result of the determination at step S305, the first flag cell does not have the value '0', it can be determined that the LSB program has not been completed on corresponding main cells. That is, it is determined that abnormal conditions have occurred while performing the LSB program and therefore the program operation has been stopped. For example, the abnormal condition can include a case where the execution of a program is stopped due to an abrupt loss of power.

In order to read LSB data in a state where the LSB program is not completed, the data of the main cells is read once using a read voltage R0 at step S307 and the read data are output as the LSB data at step S309. Accordingly, although the LSB program is stopped abnormally, LSB data can be read more precisely. In order to disregard data read in the main cells at S303, the page buffers can be reset and the step (S307) can be performed.

A method of reading MSB data can employ two kinds of methods. First, MSB data can be read as shown in FIG. 3C.

Referring to FIG. 3C, if a MSB data read command is input at step S321, the main cells are read using a read voltage R0 at step S323. The main cells and the flag cells are read using a read voltage R2 in a state where the main cells are read at step S325. The flag cell is a second flag cell, indicating the completion of a MSB program.

It is then determined whether the data of the second flag cell has a value '0' at step S327. If, as a result of the determination at step S327, the data of the second flag cell has the value '0', the MSB program has been completed normally. The read data is output as MSB data at step S331. If, as a result of the determination at step S327, the data of the second flag cell does not have the value '0', the MSB program has not been completed normally. Thus, the MSB data is set to '1' and then output at step S329. This is because in a state where the MSB program is not performed, the MSB data is generally considered to have the value '1'.

The data reading process of the steps S323 and S325 is described below in more detail.

Typically, when reading data of the flash memory device 100, the page buffer circuit is set to have an initial data state through initialization, and the data read operation is then performed. If the threshold voltage of a memory cell is higher than a read voltage, the initial data is changed. If the threshold voltage of the memory cell is not read, the initial data is maintained as it is.

In other words, assuming that data '1' is initially set to the page buffer as an initial data, when data of the main cells having the threshold voltage distributions as shown in FIG. 3A is read using the read voltage R0, a page buffer connected to the main cells belonging to the first threshold voltage distributions 310 maintain the initial data '1'. Initial data of the main cells belonging to the second to fourth threshold voltage distributions 320 to 340 is then changed to '0' data.

Thereafter, when the data is read using the read voltage R2, the data state of the main cells belonging to the first to third threshold voltage distributions 310 to 320 is not changed and the data state of the main cells belonging to the fourth threshold voltage distributions 340 is changed to the value '1'. Thus, the MSB data of the main cells belonging to the first threshold voltage distributions 310 becomes '1', the MSB data of the main cells belonging to the second and third threshold voltage distributions 320, 330 becomes '0', and the MSB data of the main cells belonging to the fourth threshold voltage distributions 340 becomes '1'.

If, as a result of the determination at step S327, the second flag does not have the value '0' since the MSB program has not been completed, the MSB data is arbitrarily set to '1' and the MSB data read at the steps S323 and S325 is disregarded.

Another method of reading MSB data is described below with reference to FIG. 3D.

Referring to FIG. 3D, if a MSB read command is input at step S341, data of the main cells and the flag cells is read using a read voltage R2 at step S343. Here, the flag cell refers to a second flag cell as described above with reference to FIG. 3C.

It is then determined whether the second flag cell has a value '0' at step S345. If, as a result of the determination at step S345, the second flag cell has the value '0', data of the main cells is read once again using a read voltage R0 at step S347. The read data is output as MSB data at step S351. However, if, as a result of the determination at step S345, the second flag cell does not have the value '0', MSB data is fixed to a value '1' irrespective of the read data at step S349. The MSB data is then output at step S351.

In the methods of FIGS. 3C and 3D, when a MSB program is not completed, if MSB data is read using the method of FIG. 3D, the step of reading data using the read voltage R0 can be reduced, thereby reducing operation time.

The flag cells may be programmed as follows without programming them as shown in FIG. 3A.

Figure 4A:
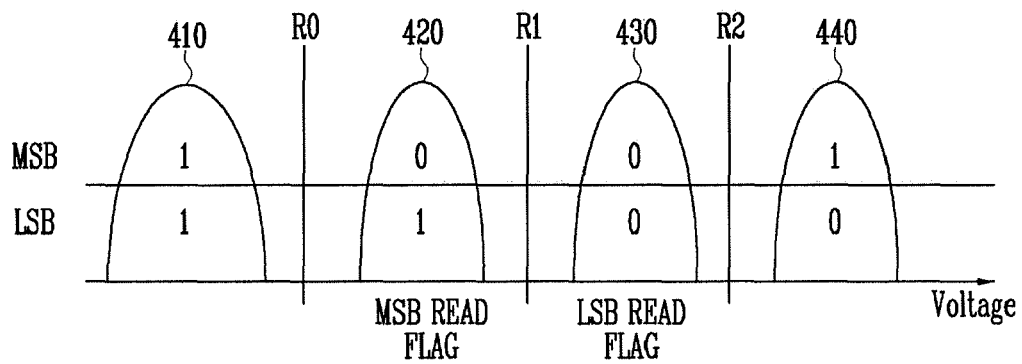
FIG. 4A illustrates threshold voltage distributions of flag cells and FIGS. 4B to 4D are flowcharts illustrating a data read operation, according to a second embodiment of the present invention.
Figure 4B:
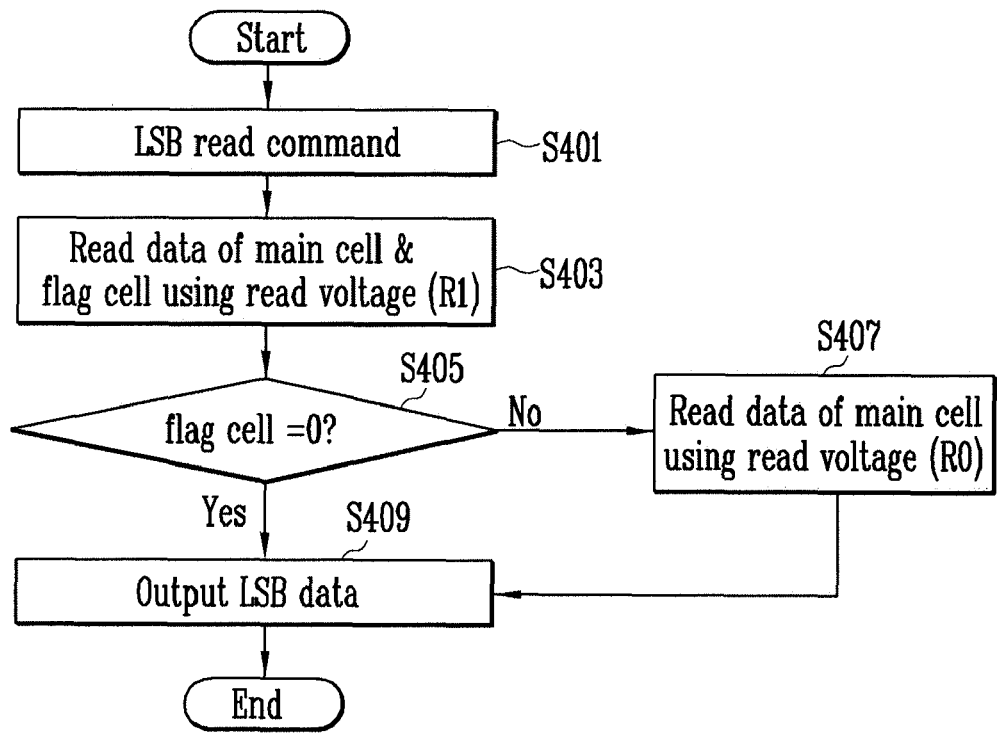
Figure 4C:
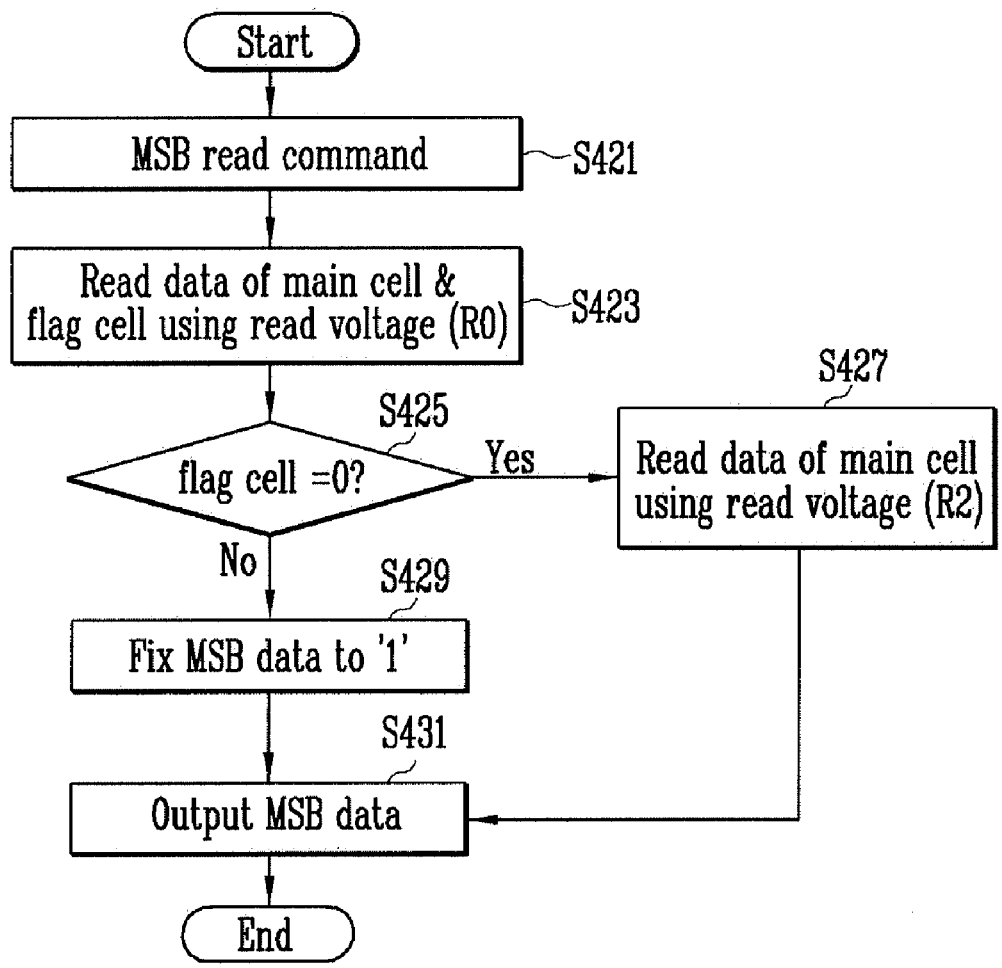
Figure 4D:
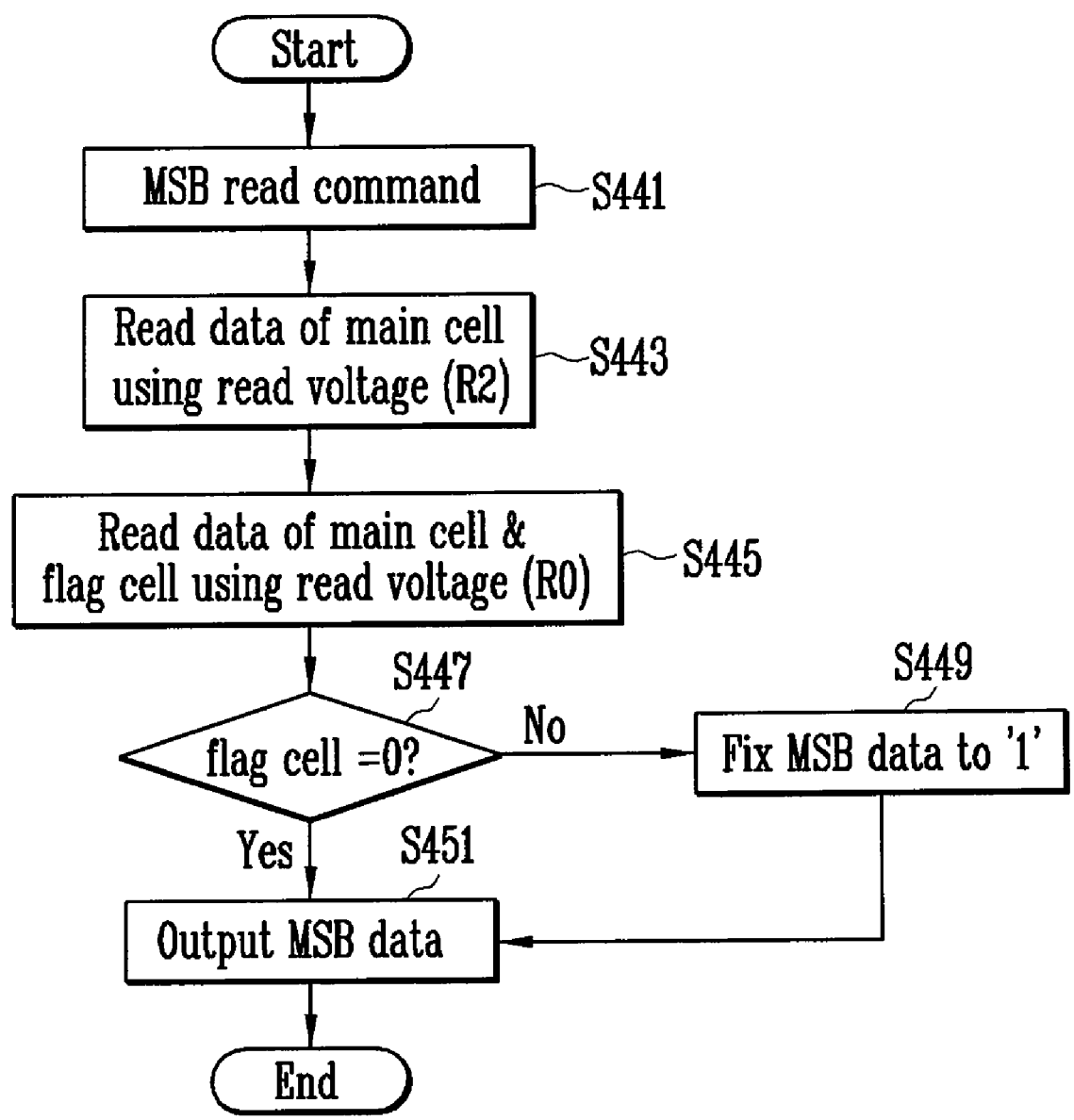

FIG. 4A illustrates threshold voltage distributions of flag cells and FIGS. 4B to 4D are flowcharts illustrating a data read operation, according to a second embodiment of the present invention.

FIG. 4A illustrates threshold voltage distributions of flag cells according to a second embodiment of the present invention. FIG. 4B is a flowchart illustrating a LSB data read method of the flash memory device including the flag cells of FIG. 4A. FIG. 4C is a flowchart illustrating a MSB data read method of the flash memory device including the flag cells of FIG. 4A. FIG. 4D is another flowchart illustrating a MSB data read method of the flash memory device including the flag cells of FIG. 4A.

Referring to FIG. 4A, in a second embodiment of the present invention, a first flag cell indicating the completion of a LSB program is programmed to belong to third threshold voltage distributions 430, and a second flag cell indicating the completion of a MSB program is programmed to belong to second threshold voltage distributions 420.

A data reading method is as follows.

Referring to FIG. 4B, in a flag cell according to a second embodiment of the present invention, if a LSB data read command is input at step S401, data of main cells and flag cells are read using a read voltage R1 at step S403. Here, the flag cell refers to a first flag cell indicating a LSB program state.

It is then determined whether the read data of the first flag cell has a value '0' at step S405. If, as a result of the determination at step S405, the read data of the first flag cell has the value '0', the read data is output as LSB data at step S409. However, if, as a result of the determination at step S405, the read data of the first flag cell does not have the value '0', it is determined that the LSB program has not been completed. Thus, the read data at step S403 is disregarded and the page buffer is reset. Data of the main cells is read once again using a read voltage R0 at step S407 and then output as LSB data at step S409.

A reading process of MSB data is as follows.

Referring to FIG. 4C, if a MLC data read command is input at step S421, data of the main cells and the flag cells is read using a read voltage R0 at step S423. Here, the flag cell refers to a second flag cell indicating a MSB program state.

It is then determined whether the second flag cell has a value '0' at step S425. If, as a result of the determination at step S425, the second flag cell has the value '0', a MSB program has been completed. Thus, data of the main cells is read once again using a read voltage R2 at step S427, and the read data is output as MSB data at step S431.

However, if, as a result of the determination at step S425, the second flag cell does not the value '0', a MSB program has not been performed. Thus, all MSB data is fixed to '1' at step S429 irrespective of the read data and the MSB data is then output at step S431.

Still another method other than the above MSB data read method may be used.

Referring to FIG. 4D, if a MSB read command is input at step S441, data of the main cells is read using a read voltage R2 at step S443. Data of the main cells and flag cells are then read using a read voltage R0 at step S445. The flag cell is a second flag cell.

It is then determined whether the second flag cell has a value '0' at step S447. If, as a result of the determination at step S447, the second flag cell has the value '0', the read data is output as MSB data at step S451. However, if, as a result of the determination at step S447, the second flag cell does not have the value '0', the MSB data is changed to a value '1' and is then output at step S449.

Alternatively, the flag cell may be set as follows.

Figure 5A:
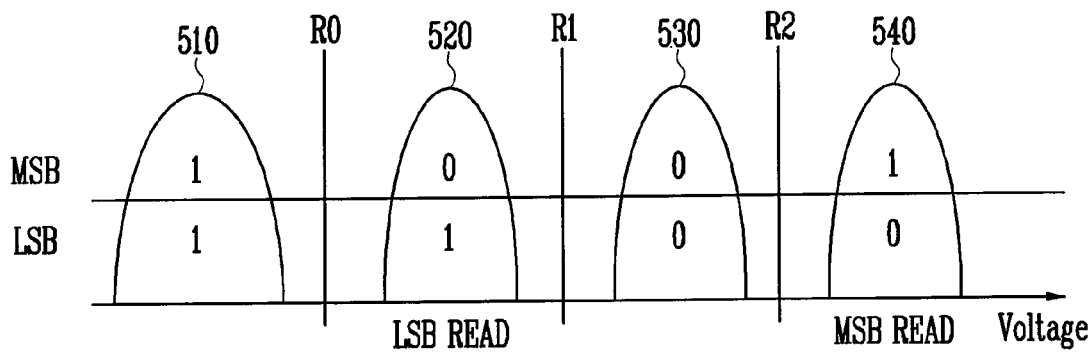
FIG. 5A illustrates threshold voltage distributions of flag cells and FIGS. 5B to 5D are flowcharts illustrating a data read operation, according to a third embodiment of the present invention.
Figure 5B:
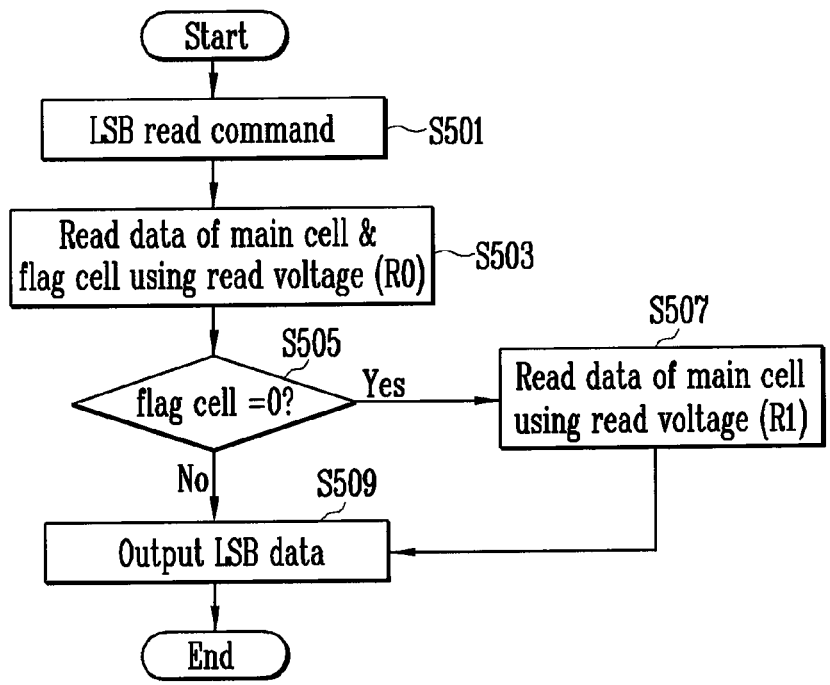
Figure 5C:
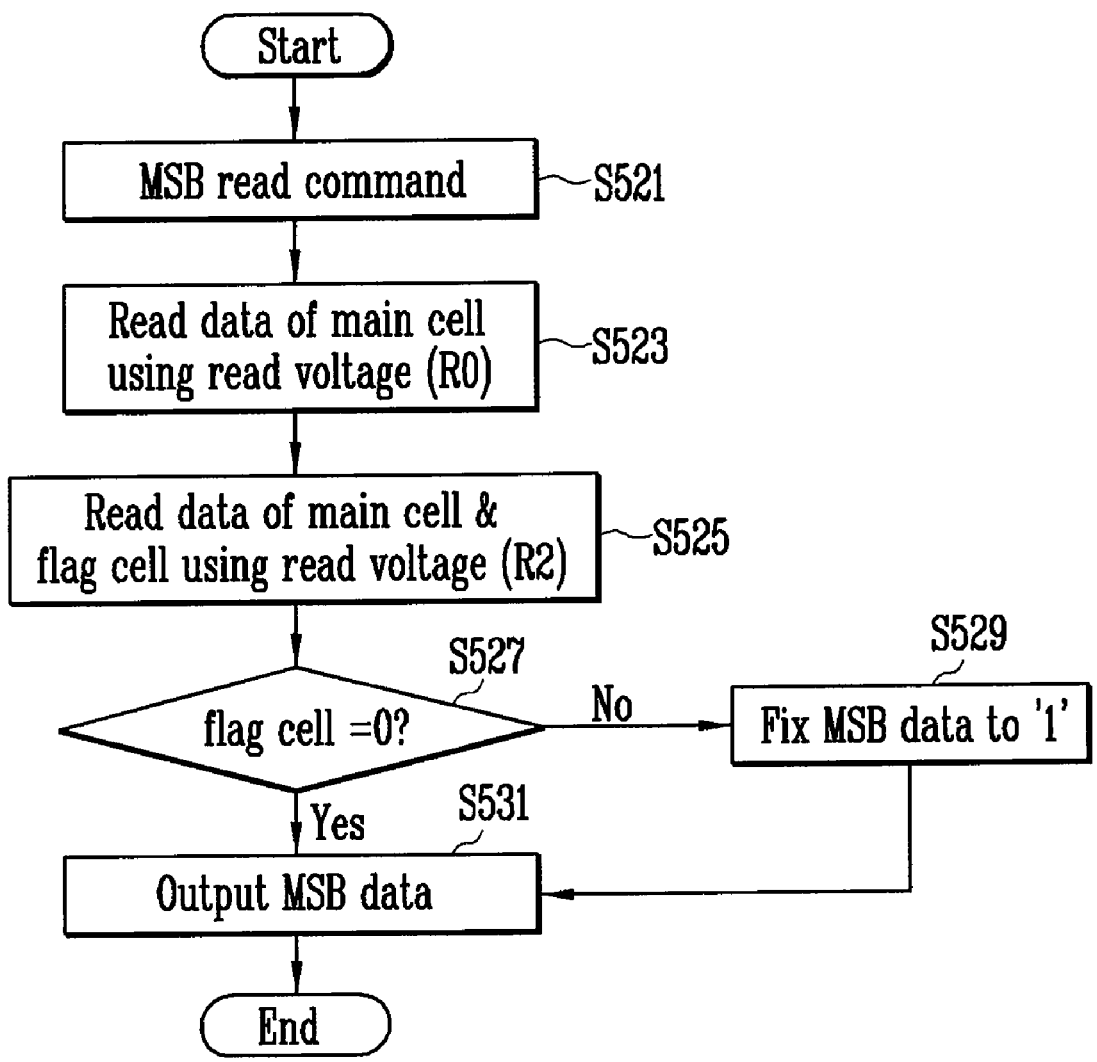
Figure 5D:
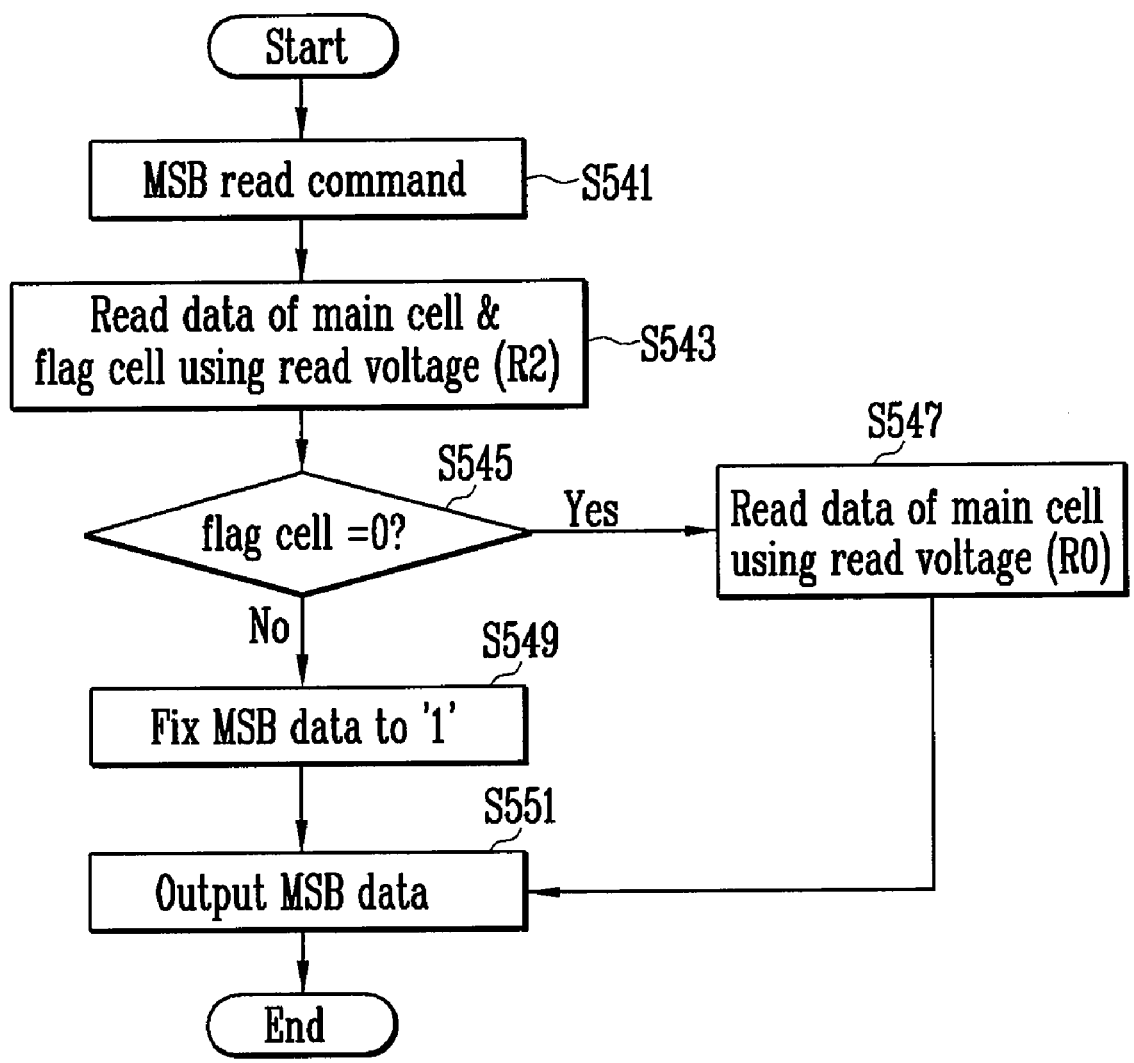

FIG. 5A illustrates threshold voltage distributions of flag cells and FIGS. 5B to 5D are flowcharts illustrating a data read operation, according to a third embodiment of the present invention.

FIG. 5A illustrates threshold voltage distributions of flag cells according to a third embodiment of the present invention. FIG. 5B is a flowchart illustrating a LSB data read method of the flash memory device including the flag cells of FIG. 5A. FIG. 5C is a flowchart illustrating a MSB data read method of the flash memory device including the flag cells of FIG. 5A. FIG. 5D is another flowchart illustrating a MSB data read method of the flash memory device including the flag cells of FIG. 5A.

Referring to FIG. 5A, in a third embodiment of the present invention, a first flag cell indicating the completion of a LSB program is programmed to belong to second threshold voltage distributions 520, and a second flag cell indicating the completion of a MSB program is programmed to belong to fourth threshold voltage distributions 540.

A data reading process is described below.

Referring to FIG. 5B, in a flag cell according to a third embodiment of the present invention, if a LSB data read command is input at step S501, data of main cells and flag cells are read using a read voltage R0 at step S503. The flag cell refers to a first flag cell.

It is then determined whether the first flag cell has a value '0' at step S505. If, as a result of the determination at step S505, the first flag cell has the value '0', the data read at step S503 is disregarded and the page buffer is reset. Data of the main cell is then read again using a read voltage R1 at step S507 and the read data is output as LSB data at step S509.

However, if, as a result of the determination at step S505, the first flag cell does not have the value '0', the data read at step S503 is output as LSB data at step S509.

MSB data is read as follows.

Referring to FIG. 5C, if a MSB data read command is input at step S521, data of the main cell is read using a read voltage R0 at step S523. Subsequent to the step S523, data of the main cells and the flag cells is read using a read voltage R2 at step S525. Here, the flag cell refers to a second flag cell.

It is then determined whether the second flag cell has a value '0' at step S527. If, as a result of the determination at step S527, the second flag cell has the value '0', the read data is output as MSB data at step S531. However, if, as a result of the determination at step S527, the second flag cell does not have the value '0', MSB data is fixed to a value '1' irrespective of the read data at step S529. The MSB data is then output at step S531.

Another method of reading MSB data can be used as follows.

Referring to FIG. 5D, if a MSB read command is input at step S541, data of the main cell and the flag cell is read using a read voltage R2 at step S543. Here, the flag cell refers to a second flag cell.

It is then determined whether the second flag cell has a value '0' at step S545. If, as a result of the determination at step S545, the second flag cell has the value '0', data of the main cell is read once again using a read voltage R0 at step S547. The read data is output as MSB data at step S551.

However, if, as a result of the determination at step S545, the second flag cell does not have the value '0', MSB data is fixed to a value '1' irrespective of the read data at step S549. The MSB data is then output at step S551.

In the first to third embodiments described with reference to FIGS. 3A to 5D, program combination and data reading methods of the flag cells when the first flag cell indicating the completion of the LSB program is used, when the second flag cell indicating the completion of the MSB program, and when both the first and second flag cells are used have been described.

However, only one flag cell can be employed.

Figure 6A:
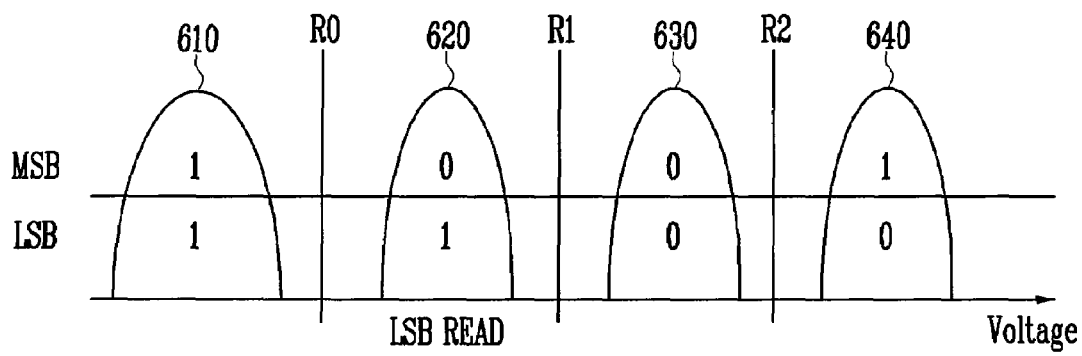
FIG. 6A illustrates threshold voltage distributions of flag cells and FIGS. 6B to 6D are flowcharts illustrating a data read operation, according to a fourth embodiment of the present invention.
Figure 6B:
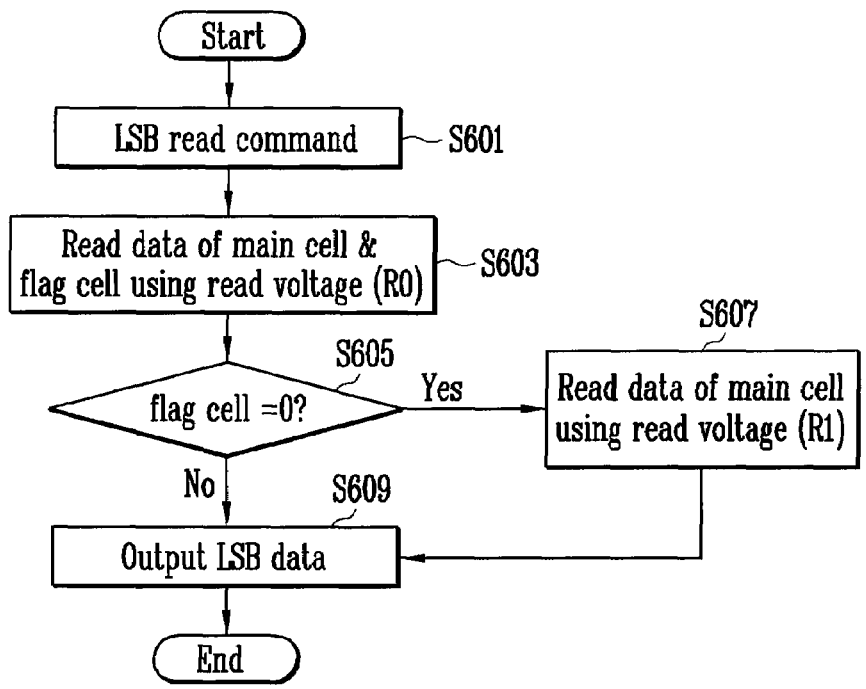
Figure 6C:
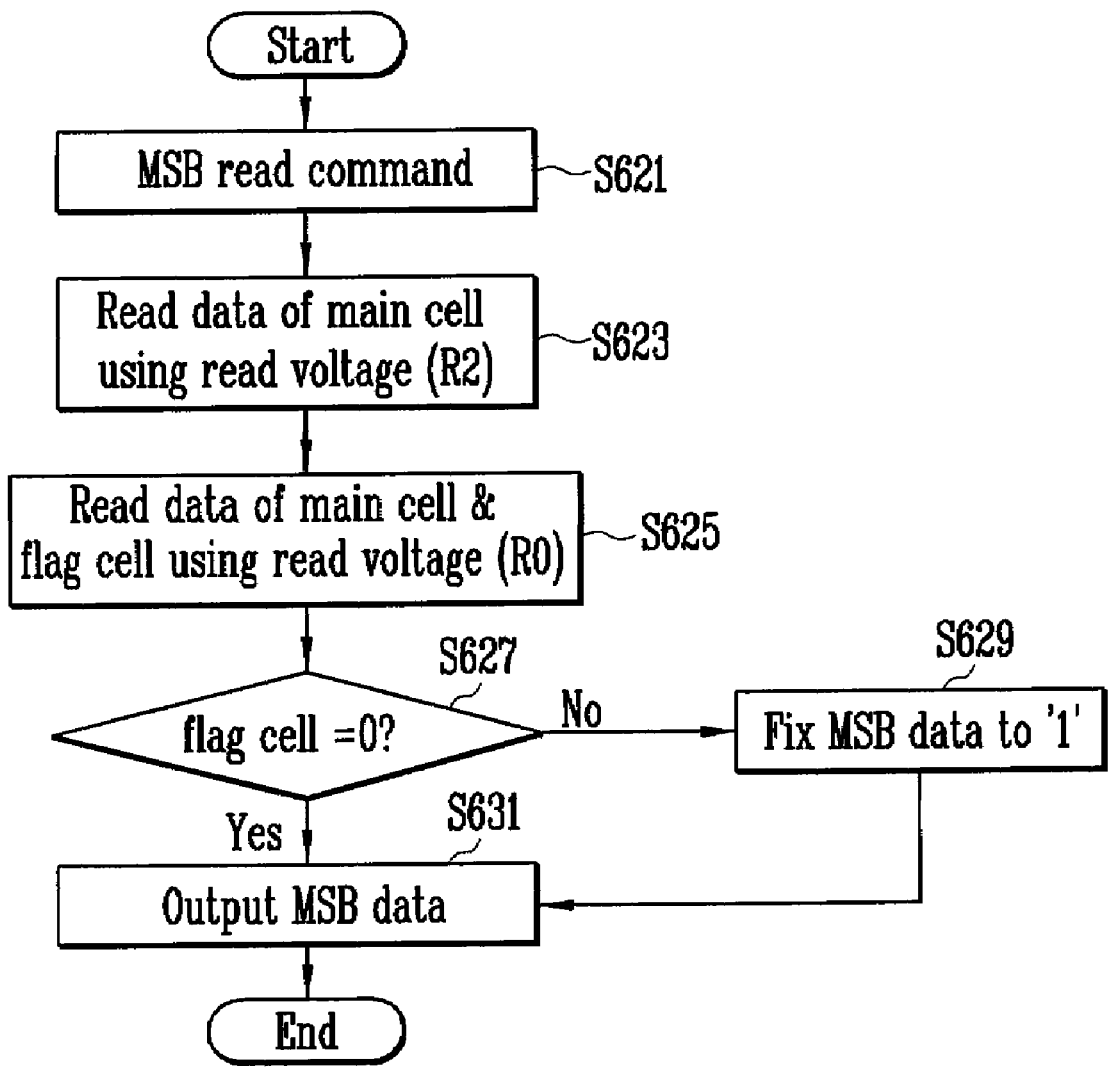
Figure 6D:
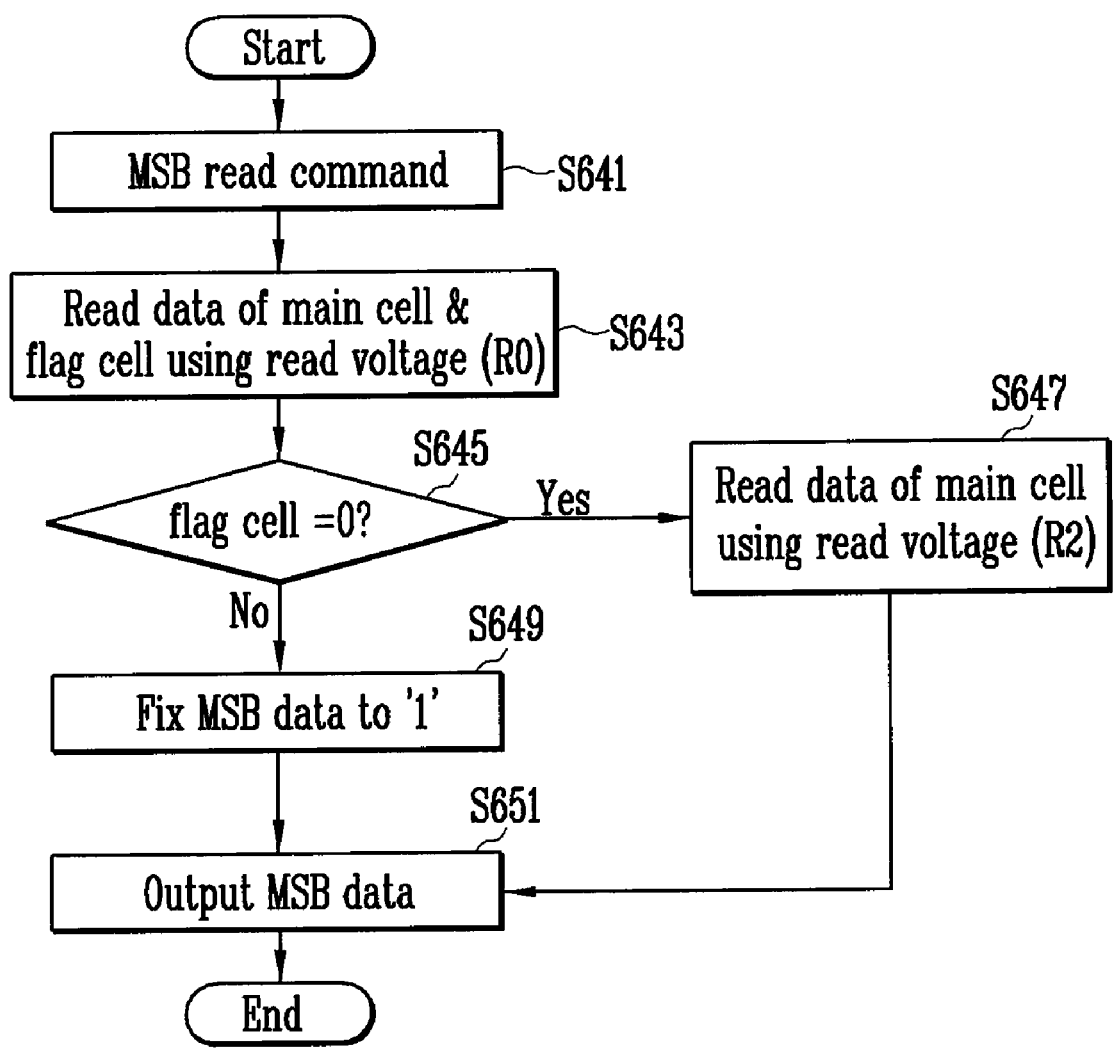

FIG. 6A illustrates threshold voltage distributions of flag cells and FIGS. 6B to 6D are flowcharts illustrating a data read operation, according to a fourth embodiment of the present invention.

FIG. 6A illustrates threshold voltage distributions of flag cells according to a fourth embodiment of the present invention. FIG. 6B is a flowchart illustrating a LSB data read method of the flash memory device including the flag cells of FIG. 6A. FIG. 6C is a flowchart illustrating a MSB data read method of the flash memory device including the flag cells of FIG. 6A. FIG. 6D is another flowchart illustrating a MSB data read method of the flash memory device including the flag cells of FIG. 6A.

Referring to FIG. 6A, in a fourth embodiment of the present invention, the flag cells are programmed to belong to second threshold voltage distributions 620. When one flag cell is used, the flag cell is programmed only when both a LSB program and a MSB program are completed.

A method of reading data using the above method is described below.

Referring to FIG. 6B, if a LSB read command is input to read LSB data at step S601, data of the main cell and the flag cell is read using a read voltage R0 at step S603. It is then determined whether the flag cell has a value '0' at step S605.

If, as a result of the determination at step S605, the flag cell has the value '0', the data read at step S603 is disregarded and the page buffer is reset. Thereafter, data of the main cell is read using a read voltage R1 at step S607 and the read data is output as LSB data at step S609. However, if, as a result of the determination at step S605, the flag cell does not have the value '0', the data read at step S603 is output as the LSB data at step S609.

Referring to FIG. 6C, in order to read MSB data after the LSB data is read, if a MSB read command is input at step S621, data of the main cell is first read using a read voltage R2 at step S623. Data of the main cell and the flag cell is read using a read voltage R0 at step S625.

It is then determined whether the flag cell has a value '0' at step S627. If, as a result of the determination at step S627, the flag cell has the value '0', the data read at step S625 is output as MSB data at step S631. However, if, as a result of the determination at step S627, the flag cell does not have the value '0', MSB data is fixed to a value '1' irrespective of the data read at step S629. The MSB data is then output at step S631.

Further, a read method of MSB data can be performed as follows.

Referring to FIG. 6D, if a MSB read command is input at step S641, data of the main cell and the flag cell is read using a read voltage R0 at step S643. It is then determined whether the flag cell has a value '0' at step S645. If, as a result of the determination at step S645, the flag cell has the value '0', data of the main cell is read once again using a read voltage R2 at step S647. The read data is then output as MSB data at step S651.

However, if, as a result of the determination at step S645, the flag cell does not have the value '0', MSB data is fixed to a value '1' at step S649. The MSB data is then output at step S651.

The above first to fourth embodiments have been described in connection with a data read method when the gray code is applied to data values of a MLC capable of storing 2-bit data. However, a combination of flag cells can be applied in various ways as in the first to fourth embodiments even when a binary code (BCD) other than the gray code is applied. Similar operations as those of FIGS. 3A to 6D can be implemented by changing only the sequence or method of the read voltages depending on data code states.

If flag cells are employed in the program operation of a MLC in this manner, data can be read accurately even when an operation is stopped unpredictably during a program operation. Accordingly, reliability of data reading can be improved. In particular, the embodiments of the present invention illustrate a case where a MLC is programmed according to the fix level. In general, a MLC using the fix level can have high data reliability when compared with a case where a MLC does not use flag cells.

As described above, according to a method of operating a MLC flash memory device in accordance with the present invention, reliability of data reading of a flash memory device whose operation is stopped before a program operation is completed can be increased by employing flag cells indicating the progress status of the program.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of operating a flash memory device including a multi-level cell (MLC) capable of storing plural bits of data therein, the method comprising:
    performing a first read operation of a main cell and a first flag cell by a first read voltage or a second read voltage that is higher than the first read voltage, wherein a first data of the main cell read by the first read voltage becomes a first bit data when the first flag cell has a non-program state, and a first data of the main cell read by the second read voltage becomes the first bit data when the first flag cell has a program state; and
    performing a second read operation of the main cell and a second flag cell by one or both of the first read voltage and a third read voltage that is higher than the second read voltage, wherein a second data of the main cell read by both of the first read voltage and the third read voltage becomes a second bit data when the second flag cell has a program state, or the second bit data is fixed to a predetermined set data when the second flag cell has a non-program state.

2. The method of claim 1, wherein the step of performing the first read operation comprises:
    performing a read operation of the main cell and the first flag cell by the second read voltage, wherein a data of the main cell read by the second read voltage of the main cell becomes the first bit data when a threshold voltage of the first flag cell is higher than the second read voltage; and
    performing a read operation of the main cell by the first read voltage if the threshold voltage of the first flag cell is lower than the second read voltage, wherein a data of the main cell read by the first read voltage becomes the first bit data.

3. The method of claim 1, wherein the second read operation is performed on the main cell and the second flag cell by the first read voltage and the third read voltage, when a threshold voltage of the second flag cell having a program state is higher than the third read voltage.

4. The method of claim 1, wherein the step of performing the second read operation comprises:
    performing a read operation of the main cell and the second flag cell by the third read voltage, wherein the second bit data is fixed to the determined set data when a threshold voltage of the second flag cell is lower than the third read voltage; and
    performing a read operation of the main cell by the first read voltage when the threshold voltage of the second flag cell is higher than the third read voltage, wherein a data of the main cell obtained by the third and the first read voltages becomes the second bit data.

5. The method of claim 1, wherein the step of performing the second read operation comprises:
    performing a read operation of the main cell and the second flag cell by the first read voltage, wherein the second bit data is fixed to the determined set data when a threshold voltage of the second flag cell is lower than the first read voltage; and
    performing a read operation of the main cell by the third read voltage when the threshold voltage of the second flag cell is higher than the first read voltage, wherein a data of the main cell obtained by the first read voltage and the third read voltage becomes the second bit data.

6. The method of claim 1, wherein the second read operation is performed on the main cell and the second flag cell by the first read voltage and the third read voltage when a threshold voltage of the second flag cell having a program state is higher than the first read voltage and is lower than the third read voltage.

7. The method of claim 1, wherein the step of performing the first read operation comprises:
    performing a read operation of the main cell and the first flag cell by the first read voltage, wherein a data of the main cell read by the first read voltage becomes the first bit data when a threshold voltage of the first flag cell is lower than the first read voltage; and
    performing a read operation of the main cell by the second read voltage when the threshold voltage of the first flag cell is higher than the first read voltage, wherein a data of the main cell read by the second read voltage becomes the first bit data.

8. A method of operating a flash memory device including a MLC capable of storing plural bits of data therein, the method comprising:
    performing a first read operation of a main cell and a flag cell by a first read voltage, wherein a first data read by the first read voltage becomes a first bit data when a threshold voltage of the flag cell is lower than the first read voltage;
    performing a second read operation of the main cell by a second read voltage that is higher than the first read voltage when the threshold voltage of the flag cell is higher than the first read voltage, wherein a second data of the main cell read by the second read voltage becomes the first bit data; and performing a third read operation of the main cell and the flag cell by one or both of the first read voltage and a third read voltage that is higher than the second read voltage, wherein the third data of the main cell obtained by the first read voltage and the third read voltage becomes a second bit data when the threshold voltage of the flag cell is higher than the first read voltage, or the second bit data is fixed to a predetermined set data when the threshold voltage of the flag cell is lower than the first read voltage.

9. The method of claim 8, wherein the third read operation is performed on the main cell and the flag cell by the first read voltage and the third read voltage, when the threshold voltage of the flag cell has a program state that is higher than the first read voltage.

10. The method of claim 9, wherein performing the third read operation comprises:
performing a read operation of the main cell and the flag cell by the first read voltage wherein the second bit data is fixed to the determined set data when the threshold voltage of the flag cell is lower than the first read voltage; and
performing a read operation of the main cell by the third read voltage when the threshold voltage of the flag cell is higher than the first read voltage, wherein the data of the main cell obtained by the first read voltage and the third read voltage becomes the second bit data.

11. A method of operating a flash memory device including a multi-level cell (MLC) capable of storing plural bits of data therein, the method comprising:
performing a first read operation of a main cell and a first flag cell by a second read voltage that is higher than a first read voltage, wherein a first data read by the first read operation of the main cell becomes a first bit data when the first flag cell has a program state;
performing a second read operation of the main cell by the first read voltage when the first flag cell has a non-program state, wherein a second data read by the second read operation of the main cell becomes the first bit data;
performing a third read operation of the main cell by the first read voltage; and
performing a fourth read operation of the main cell and a second flag cell by a third read voltage that is higher than the second read voltage,
wherein a data of the main cell obtained by the third read operation and the fourth read operation of the main cell becomes the second bit data when the second flag cell has a program state or changes to a predetermined set data when the second flag cell has a non-program state.

12. A method of operating a flash memory device including a multi-level cell (MLC) capable of storing plural bits of data therein, the method comprising:
performing a first read operation of a main cell and a first flag cell by a second read voltage that is higher than a first read voltage, wherein a first data read by the first read operation of the main cell becomes a first bit data when the first flag cell has a program state;
performing a second read operation of the main cell by the first read voltage when the first flag cell has a non-program state, wherein a second data read by the second read operation of the main cell becomes the first bit data;
performing a third read operation of the main cell and a second flag cell by a third read voltage that is higher than the second read voltage, wherein a predetermined set data becomes a second bit data when the second flag cell has a non-program state; and
performing a fourth read operation of the main cell by the first read voltage when the second flag cell has a program state, wherein a data of the main cell obtained by the third read operation and the fourth read operation of the main cell becomes the second bit data.

13. A method of operating a flash memory device including a multi-level cell (MLC) capable of storing plural bits of data therein, the method comprising:
performing a first read operation of a main cell and a first flag cell by a second read voltage that is higher than a first read voltage, wherein a first data read by the first read operation of the main cell becomes a first bit data when the first flag cell has a program state;
performing a second read operation of the main cell by the first read voltage when the first flag cell has a non-program state, wherein a second data read by the second read operation of the main cell becomes the first bit data;
performing a third read operation of the main cell and a second flag cell by the first read voltage, wherein a predetermined set data becomes a second bit data when the second flag cell has a non-program state; and
performing a fourth read operation of the main cell by a third read voltage that is higher than the second read voltage when the second flag cell has a program state wherein a data of the main cell obtained by the third read operation and the fourth read operation of the main cell becomes the second bit data.

14. A method of operating a flash memory device including a multi-level cell (MLC) capable of storing plural bits of data therein, the method comprising:
performing a first read operation of a main cell and a first flag cell by a second read voltage that is higher than a first read voltage, wherein a first data read by the first read operation of the main cell becomes a first bit data when the first flag cell has a program state;
performing a second read operation of the main cell by the first read voltage when the first flag cell has a non-program state, wherein a second data read by the second read operation of the main cell becomes the first bit data;
performing a third read operation of the main cell by a third read voltage that is higher than the second read voltage; and
performing a fourth read operation of the main cell and a second flag cell by the first read voltage,
wherein a data of the main cell obtained by the third read operation and the fourth read operation of the main cell becomes the second bit data when the second flag cell has a program state or changes to a predetermined set data when the second flag cell has a non-program state.

15. A method of operating a flash memory device including a multi-level cell (MLC) capable of storing plural bits of data therein, the method comprising:
performing a first read operation of a main cell and a first flag cell by a first read voltage, wherein a first data read by the first read operation of the main cell becomes a first bit data when the first flag cell has a non-program state;
performing a second read operation of the main cell by a second read voltage that is higher than the first read voltage when the first flag cell has a program state, wherein a second data of the main cell read by the second read operation becomes the first bit data;
performing a third read operation of the main cell by the first read voltage; and
performing a fourth read operation of the main cell and a second flag cell by a third read voltage that is higher than the second read voltage, wherein a data of the main cell obtained by the third read operation and the fourth read operation of the main cell becomes the second bit data when the second flag cell has a program state or changes to a predetermined set data when the second flag cell has a non-program state.

16. A method of operating a flash memory device including a multi-level cell (MLC) capable of storing plural bits of data therein, the method comprising:

performing a first read operation of a main cell and a first flag cell by a first read voltage, wherein a first data read by the first read operation of the main cell becomes a first bit data when the first flag cell has a non-program state;

performing a second read operation of the main cell by a second read voltage that is higher than the first read voltage when the first flag cell has a program state, wherein a second data read by the second read operation of the main cell becomes the first bit data;

performing a third read operation of the main cell and a second flag cell by a third read voltage that is higher than the second read voltage, wherein a predetermined set data becomes a second bit data when the second flag cell has a non-program state; and performing a fourth read operation of the main cell by the first read voltage when the second flag cell has a program state, wherein a data of the main cell obtained by the third read operation and the fourth read operation of the main cell becomes the second bit data.

17. A method of operating a flash memory device including a multi-level cell (MLC) capable of storing plural bits of data therein, the method comprising:

performing a first read operation of a main cell and a flag cell by a first read voltage, wherein a first data read by the first read operation of the main cell becomes a first bit data when the flag cell has a non-program state;

performing a second read operation of the main cell by a second read voltage that is higher than the first read voltage when the flag cell has a program state, wherein a second data read by the second read operation of the main cell becomes the first bit data;

performing a third read operation of the main cell by a third read voltage that is higher than the second read voltage; and performing a fourth read operation of the main cell and the flag cell by the first read voltage, wherein a data of main cell obtained by the third and fourth read operation of main cell becomes the second bit data when the flag cell has a program state or changes to a predetermined set data when the flag cell has a non-program state.

18. A method of operating a flash memory device including a multi-level cell (MLC) capable of storing plural bits of data therein, the method comprising:

performing a first read operation of a main cell and a flag cell by a first read voltage, wherein a first data read by the first read operation of the main cell becomes a first bit data when the flag cell has a non-program state;

performing a second read operation of the main cell by a second read voltage that is higher than the first read voltage when the flag cell has a program state, wherein a second data read by the second read operation of the main cell becomes the first bit data;

performing a third read operation of the main cell and the flag cell by the first read voltage, wherein a predetermined set data becomes a second bit data when the flag cell has a non-program state; and performing a fourth read operation of the main cell by a third read voltage that is higher than the second read voltage when the flag cell has a program state, wherein a data of the main cell obtained by the third and fourth read operation of the main cell becomes the second bit data.

* * * * *